(12) United States Patent
Straub et al.

(10) Patent No.: US 7,226,653 B2
(45) Date of Patent: Jun. 5, 2007

(54) PRINTED CIRCUIT BOARD AND METHOD FOR PRODUCING A PRINTED CIRCUIT BOARD

(75) Inventors: Peter Straub, Oberwil bei Zug (CH); Peter Weber, Rüschlikon (CH)

(73) Assignee: PPC Electronic AG, Cham (CH)

( * ) Notice: Subject to any disclaimer, the term of this patent is extended or adjusted under 35 U.S.C. 154(b) by 0 days.

(21) Appl. No.: 10/398,961

(22) PCT Filed: Aug. 2, 2001

(86) PCT No.: PCT/CH01/00472

§ 371 (c)(1),
(2), (4) Date: Apr. 11, 2003

(87) PCT Pub. No.: WO02/32199
PCT Pub. Date: Apr. 18, 2002

(65) Prior Publication Data
US 2004/0028883 A1   Feb. 12, 2004

(30) Foreign Application Priority Data
Oct. 13, 2000   (CH) ................................ 2020/00

(51) Int. Cl.
*B32B 3/00*   (2006.01)
*H05K 1/00*   (2006.01)
*H01L 23/14*  (2006.01)

(52) U.S. Cl. .................. 428/210; 428/209; 174/250; 174/262; 257/700; 257/702

(58) Field of Classification Search ........ 428/209–210, 428/901; 174/250, 262; 257/700, 702
See application file for complete search history.

(56) References Cited

U.S. PATENT DOCUMENTS

| 2,913,632 | A | * | 11/1959 | Stanton | ....................... 361/812 |
| 4,715,117 | A | * | 12/1987 | Enomoto | ..................... 29/851 |
| 5,149,590 | A |   | 9/1992  | Arthur et al. | |
| 6,017,642 | A |   | 1/2000  | Kumar et al. | |
| 6,120,907 | A |   | 9/2000  | Tahon et al. | |
| 6,127,052 | A |   | 10/2000 | Tomari et al. | |
| 6,268,058 | B1 |  | 7/2001  | Tahon et al. | |
| 6,287,674 | B1 | * | 9/2001 | Verlinden et al. | ............ 428/210 |

FOREIGN PATENT DOCUMENTS

| DE | 198 10 325 A1 | 9/1999 |
| EP | 0 884 934 A * | 12/1998 |
| JP | 61 110 546 A * | 5/1986 |
| JP | 03 136294 A * | 9/1991 |
| JP | 09 208252 A * | 8/1997 |
| JP | 09 270573 A * | 1/1998 |
| JP | EP 0 972 632 A * | 1/2000 |
| WO | WO 00/50946 | 8/2000 |
| WO | WO 03/092342 A1 | 11/2003 |

* cited by examiner

*Primary Examiner*—Cathy F. Lam
(74) *Attorney, Agent, or Firm*—The Webb Law Firm

(57) ABSTRACT

A printed circuit board for an electronic circuit, especially for the ultra-high frequencies located in the GHz range that comprises at least one conductor layer, which is arranged on top of an insulating layer and which is flatly joined to said insulating layer. Improved mechanical, thermal and electrical properties are attained by virtue of the fact that the insulating layer is a thin glass layer.

21 Claims, 5 Drawing Sheets

US 7,226,653 B2

PRINTED CIRCUIT BOARD AND METHOD FOR PRODUCING A PRINTED CIRCUIT BOARD

BACKGROUND OF THE INVENTION

1. Technical Field

The present invention relates to a printed circuit board, a method for producing such a printed circuit board, and a layer composite material for such a printed circuit board.

2. Prior Art

In present-day electronic circuit technology concerning, in particular, computer technology and the communication and processing of data in communications technology, development is tending toward an ever greater integration and packing density and toward ever higher clock frequencies, which are normally already in the GHz range. Under these circumstances, increasing importance is being attached to the printed circuit boards or printed circuits in the construction of functionally reliable and, at the same time, cost-effective circuits. On the one hand, such a printed circuit board, in particular for relatively large series, must be simple and cost-effective to produce and process (cut, drill, populate, etc.). On the other hand, the printed circuit board must have a sufficient thermal and mechanical stability and the best possible thermal conductivity, because a considerable amount of heat is generally to be expected owing to the high integration density and high frequencies during operation. Furthermore, it is desirable for the printed circuit board to be adapted to the ubiquitously used semiconductor components (made of Si or else GaAs) with regard to thermal expansion, because this enables direct mounting of the semiconductor chips on the printed circuit board (Direct Chip Attach DCA) with all its advantages.

However, the dielectric properties of the insulation material used within the printed circuit board are particularly important with regard to the high frequencies. Thus, a printed circuit board used in the extremely high frequency range should have an insulating layer between the conductor layers with the lowest possible (relative) permittivity $\epsilon_r$ and a small dielectric loss factor tan$\delta$ in order to keep down the losses that increase with the frequency.

Finally, at the high clock rates and with very fine conductor tracks, it is becoming more and more important for the printed circuit board material to be distinguished by a high degree of homogeneity in the dielectric and a high uniformity in the external dimensions (small thickness fluctuations, etc.) because otherwise, in adjacent regions of the printed circuit board, undesirable propagation time differences are produced during the signal propagation and impair the functionality of the circuit constructed therewith.

All the requirements presented are satisfied only poorly or not at all by conventional epoxide-based substrate materials. Therefore, various proposals have already been made in the past in respect of using, for single or multilayer printed circuit boards, insulating intermediate layers made of a sintered glass ceramic which, at the same time, have good dielectric properties and are adapted to GaAs circuits, for example, in terms of their thermal expansion coefficient (see e.g. U.S. Pat. No. 6,017,642). However, such sintered glass ceramic substrates are complicated to produce and, as ceramic plates, have only a limited mechanical strength, so that they allow the realization of, in particular, thin single-layer printed circuit boards only with difficulty.

Another proposal relates to the use of a "glass paper"—produced from glass fibers—as dielectric for printed circuit boards (JP-A-9208252). Although such a fiber material should be less at risk of fracture compared with the glass ceramic, the irregular fibrous structure of the material results in a local inhomogeneity in the dielectric properties, which can lead to the abovementioned propagation time problems with high line densities and at high frequencies.

Finally, a whole class of substrate materials for printed circuit boards is known which comprise fluoropolymers filled with additives (ceramic particles, glass fibers) (see e.g. U.S. Pat. No. 5,149,590). Although such materials, which are commercially available for example from the US company Rogers Corp. under the designations RT/DUROID 5870–5880 and RO3000, exhibit relatively good and homogeneous dielectric properties and are therefore well suited to extremely high frequency applications, such a material is comparatively expensive on account of the complicated production and, moreover, has an unfavorable thermal expansion coefficient which is significantly higher than that of silicon.

SUMMARY OF THE INVENTION

Therefore, it is an object of the invention to provide a printed circuit board which avoids the disadvantages of known printed circuit boards and, in conjunction with comparatively simple and cost-effective production, is distinguished by very good mechanical and thermal properties, has very good dielectric properties and can thus be used up to extremely high frequencies, and is optimally adapted to the customarily used Si semiconductor chips in terms of its thermal expansion. Furthermore, it is an object of the invention to specify a method for producing such a printed circuit board.

The heart of the invention consists in providing a thin glass layer, as is known principally from the technology of liquid crystal displays (LCDs), as dielectric in the printed circuit board below the at least one conductor layer comprising conductor tracks. Even with a small thickness, such a thin glass layer has a good mechanical stability, has very advantageous dielectric and thermal properties and is distinguished by a high optical quality, which is manifested in particular in a high homogeneity of the material and a high degree of planarity with small evenness and thickness deviations. The use of a thin glass layer as dielectric makes it possible to satisfy all the requirements which are made of printed circuit boards for electronic circuits with a high integration density and extremely high frequencies.

A preferred refinement of the invention is characterized in that a respective conductor layer is arranged on both sides of the thin glass layer and connected to the thin glass layer in planar fashion. In this case, one conductor layer or both conductor layers may be structured, i.e. comprise individual conductor tracks. Such a thin glass layer provided with a conductor layer on both sides has the advantage over the one which is coated on one side that an electronic circuit realized therewith is provided with an unambiguously defined volume which is predominantly filled with the thin glass dielectric and has correspondingly favorable properties.

Preferably, the thin glass layer is pulled from the melt and comprises a modified borosilicate glass, the thin glass layer having a thickness in the range from a few µm to a few mm, preferably in the range between 30 µm and 1.1 mm, and having, at 1 MHz, a relative permittivity $\epsilon_r$ of between 6 and 7, preferably of about 6.2, and a dielectric loss factor tan$\delta$ of about $9 \times 10^{-4}$ and having, for temperatures of between 20 and 300° C., a thermal expansion coefficient $\alpha_{20\text{-}300}$ of between $4 \times 10^{-6} \text{K}^{-1}$ and $8 \times 10^{-6} \text{K}^{-1}$, preferably of about $4.5 \times 10^{-6} \text{K}^{-1}$.

In an advantageous manner, the conductor layers in each case comprise a metal foil, preferably a Cu metal foil, have a thickness of between 5 and 50 µm, preferably of 18 or 35 µm, and are adhesively bonded to the thin glass layers in each case by means of a connecting layer, the connecting layers essentially comprising a resin. Such resin-coated Cu foils (Resin Coated Foil or RCF) are known from the technology of HDI circuits, i.e. printed circuit boards with high integration densities.

Preferably, the connecting layers are additionally provided with a silane as adhesion promoter. Furthermore, it is advantageous if the surfaces of the thin glass layers are pretreated in order to improve the adhesion.

In the simplest case, the printed circuit board comprises an individual thin glass layer which is adhesively bonded to metal foils on both sides. Given a small thickness of the thin glass layer, this results in a thin, flexible printed circuit board having very good electrical and thermal properties.

However, it is also conceivable for the printed circuit board to comprise, in a stack one above the other, a plurality of thin glass layers adhesively bonded to metal foils and thus to form a multilayer printed circuit board which may also be provided with plated-through holes in the customary manner.

Equally, it is conceivable for the printed circuit board to comprise, besides a thin glass layer, at least one further insulating plate made of a different insulating material. The combination of conductor layer(s) and thin glass layer can thus advantageously be integrated into a printed circuit board of a conventional type.

Further embodiments emerge from the dependent claims.

BRIEF EXPLANATION OF THE FIGURES

The invention will be explained in more detail below using exemplary embodiments in connection with the drawing, in which.

DETAILED DESCRIPTION OF THE INVENTION

The invention will be explained below using examples in which a thin glass layer is provided with a structured or unstructured conductor layer in each case on both sides. However, it is also conceivable, in principle, within the scope of the invention to provide a conductor layer only on one side of the thin glass layer. The construction and the method for producing a printed circuit board or a layer composite material with such a thin glass layer "occupied" on one side emerge analogously from the explanations below.

Figure 1:
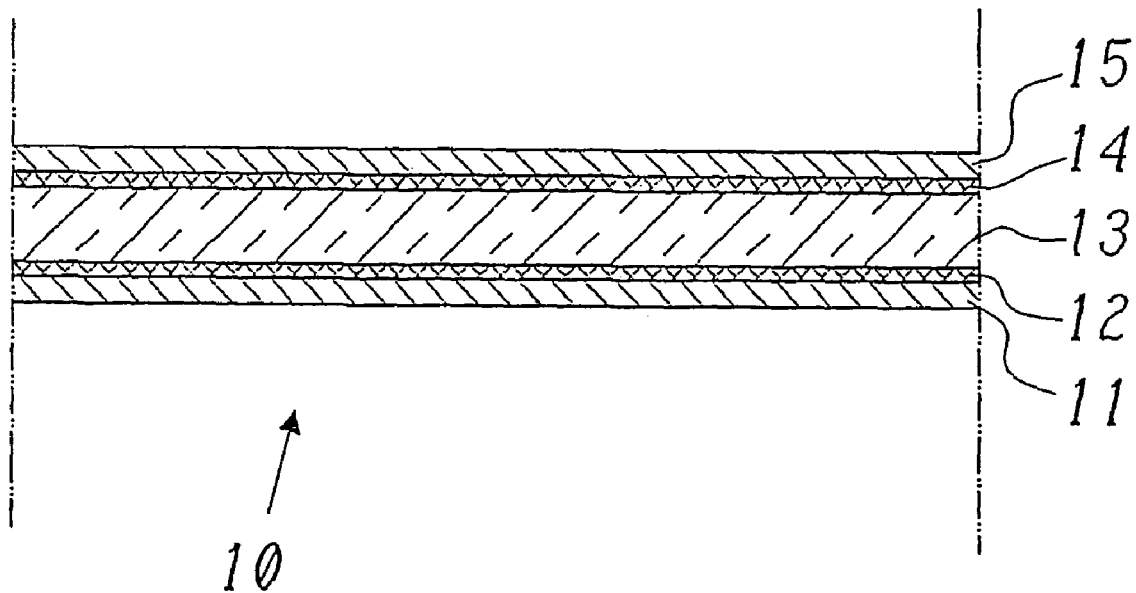
FIG. 1 shows, in a sectional illustration, the construction of an unstructured printed circuit board in accordance with a first preferred exemplary embodiment of the invention.

FIG. 1 represents, in a sectional illustration, the construction of an unstructured printed circuit board in accordance with a first preferred exemplary embodiment of the invention. In this case, the printed circuit board 10 comprises an individual thin glass layer 13, a conductor layer 11 and 15 respectively being arranged on the two sides of said thin glass layer. The conductor layers 11, 15 are formed by Cu metal foils which are adhesively bonded to the thin glass layer 13 in planar fashion by means of an adhesive connecting layer 12 and 14, respectively.

Thin glass layers of the kind provided in the context of the invention and used to achieve the advantages according to the invention are known from the prior art (see e.g. EP-A1-0 972 632 or DE-A1-198 10 325). They have thicknesses of between about 30 µm and 2 mm, are pulled from the melt, and are distinguished by a good mechanical and optical quality and excellent thermal and electrical properties. Such thin glass layers are produced commercially on a relatively large scale for electrooptical displays (e.g. LCDs) and their price is therefore comparatively favorable.

Suitable thin glass layers or thin glasses are produced and offered by the company Schott Glas, Mainz (Del.) under the type designations AF 45 and D 263 T.

The thin glass AF 45 is a modified borosilicate glass with a high proportion of BaO and $Al_2O_3$. It is normally in sizes of up to 440 mm×360 mm and is distinguished by the following properties:

| AF 45 | |
|---|---|
| Thickness (standard): | 50 µm to 1900 µm |
| Transformation point $T_g$: | 662° C. |
| Thermal expansion coefficient $a_{20-300}$: | $4.5 \times 10^{-6} K^{-1}$ |
| Rel. permittivity $\epsilon_r$ (at 1 MHz) | 6.2 |
| Dielectric loss factor tanδ: | $9 \times 10^{-4}$ |

The thin glass D 263 T is a borosilicate glass produced from very pure starting materials. It is likewise available in sizes up to 440 mm×360 mm and is distinguished by the following properties:

| D 263 T | |
|---|---|
| Thickness (standard): | 30 µm to 1100 µm |
| Transformation point $T_g$: | 557° C. |
| Thermal expansion coefficient $a_{20-300}$: | $7.2 \times 10^{-6} K^{-1}$ |
| Rel. permittivity $\epsilon_r$ (at 1 MHz): | 6.7 |
| Dielectric loss factor tanδ: | $61 \times 10^{-4}$ |

The two thin glass layers or thin glasses are particularly well suited to use in a printed circuit board according to the invention.

The production of a suitable layer composite material for the (unstructured) printed circuit board 10 in accordance with FIG. 1 is preferably effected in the manner illustrated in FIG. 5: what is used as a starting point is a thin glass layer 13, whose surfaces are firstly freed of adhereing moisture (water) and subsequently pretreated—e.g. by means of a corona discharge or the like—in order to obtain a good, permanent adhesion during the subsequent adhesive bonding. In order to produce the conductor layers 11, 15 on the thin glass layer, use is made of resin-coated metal foils (Resin Coated Foils RCFs) 28, 29 made of Cu, a connecting layer 12 and 14 respectively being applied to the adhesive bonding side thereof (FIG. 5*a*). The connecting layers 12, 14 contain a resin which, expediently, is partly cured or prereacted. Such resin-coated Cu metal foils are known from the technology of large scale integrated (HDI) circuits.

In the context of the invention, particularly suitable resin-coated foils are offered for example by the company Isola AG(Del.) under the designation ISOFOIL 160 and RCC. The (ISOFOIL 160) foils have a thickness of the copper foils of. 18 µm or 35 µm, for example, and are provided with a 75 µm resin layer which is prereacted (so-called B stage coating).

Figure 2:
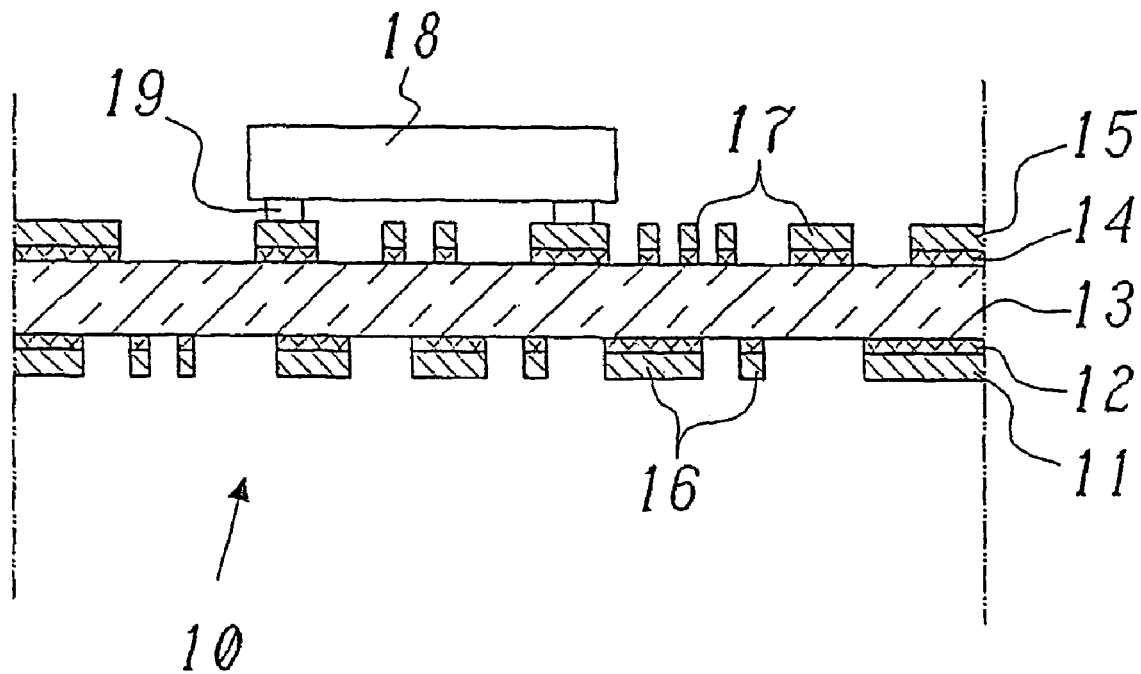
FIG. 2 shows the printed circuit board from FIG. 1 after the (two-sided) structuring of the conductor layers and with a semiconductor chip which, by way of example, is applied directly by means of the DCA method.

The resin-coated foils 28, 29 are packed, with the additional use of a silane layer for adhesion promotion (in this respect, see e.g. U.S. Pat. No. 5,149,590), with the pretreated central thin glass layer 13 to form a stack. The stack is then adhesively bonded under the action of heat and pressure (FIG. 5*b*). A layer composite material or an (unstructured) printed circuit board 10 in accordance with FIG. 1 is obtained as a result. The conductor layers 11, 15 can then optionally be structured using known methods from printed circuit board production, in order to produce as required specific conductor tracks (or conductor areas) 16, 17 (FIG. 2). By way of example, SMD devices or the like can then be soldered or conductively bonded onto the structured printed circuit board 10 in accordance with FIG. 2. A particularly advantageous type of mounting is made possible by virtue of the thermal expansion coefficients of the thin glass layer 13 which are adapted to the customary semiconductor materials: thus, in accordance with FIG. 2, a semiconductor chip 18 provided with corresponding connection contacts 19 can be mounted directly on the printed circuit board 10 (so-called Direct Chip Attach DCA). As a result of this, even higher packing densities can be achieved in conjunction with simplified mounting and high reliability.

Figure 4:
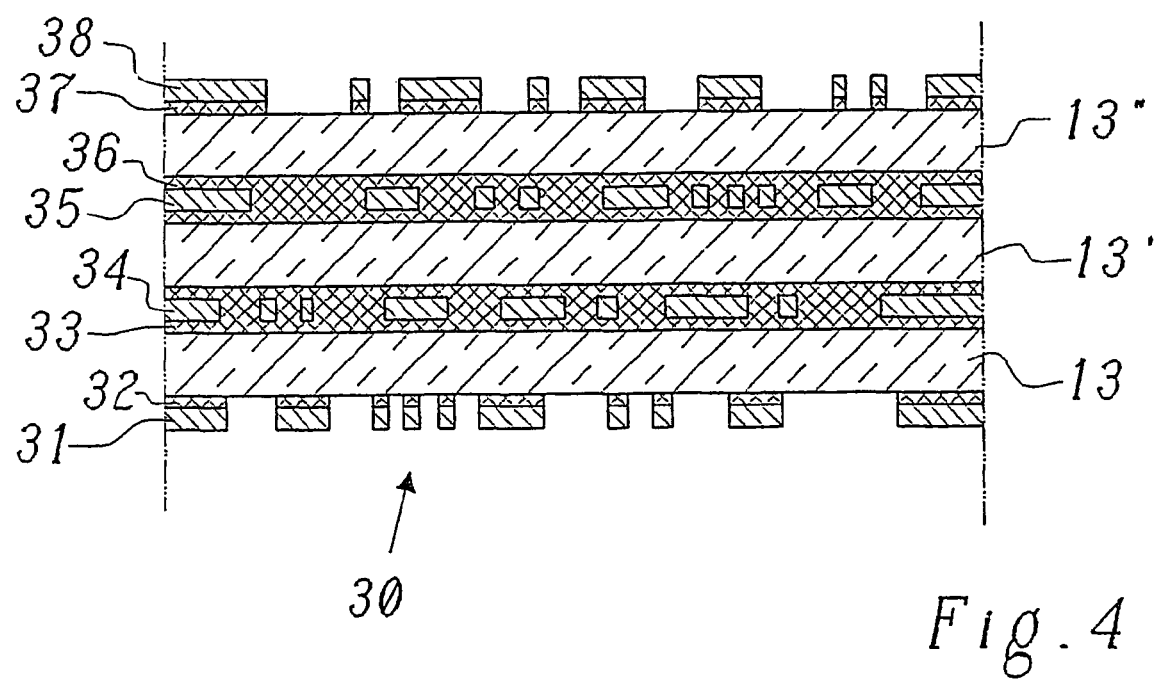
FIG. 4 shows, in a sectional illustration, the construction of a (structured) multilayer printed circuit board in accordance with a third preferred exemplary embodiment of the invention.
Figure 5:
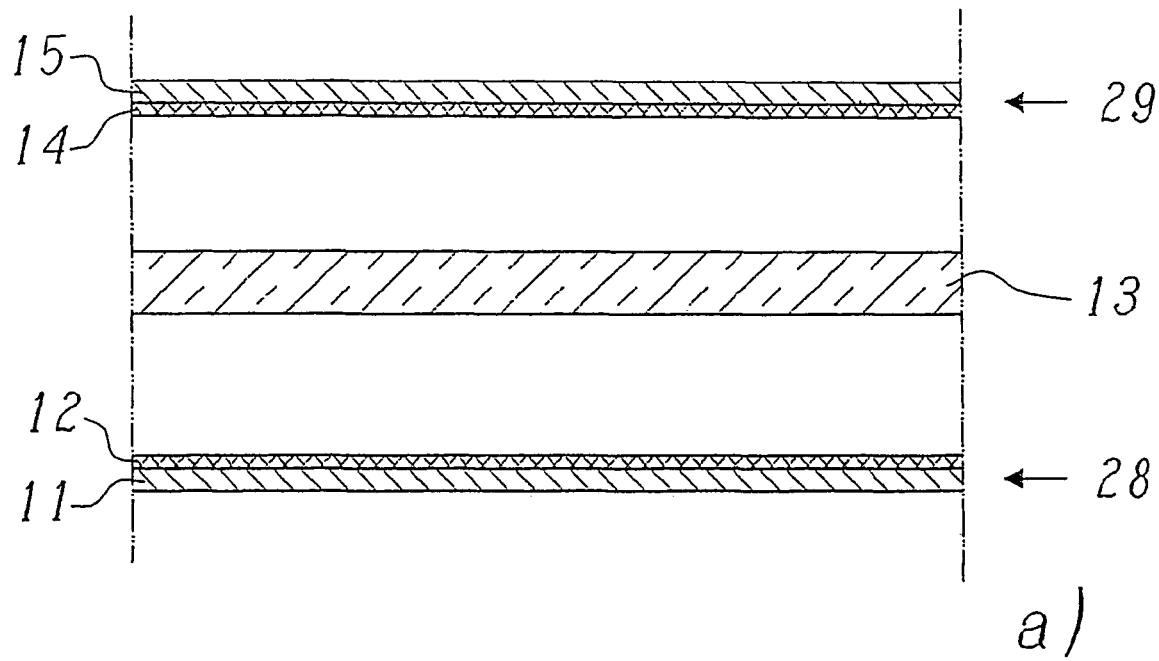
FIGS. 5a and 5b show a method for producing a layer composite material for a printed circuit board according to FIG. 1 in accordance with a preferred exemplary embodiment of the invention.
Figure 5:
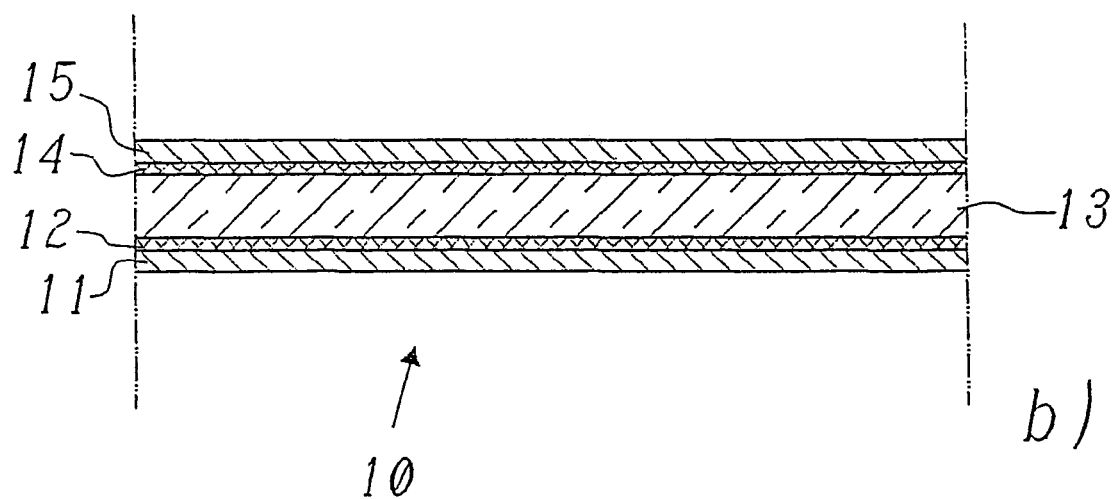

In addition to the simple printed circuit board 10 from FIGS. 1, 2 and 5 which comprises only one thin glass layer 13 and two conductor layers 11 and 15 and can therefore be made particularly thin and flexible, it is also possible to realize in an analogous manner multilayer printed circuit boards 30 which comprise, in a stack one above the other, a plurality of thin glass layers 13, 13' and 13" with conductor layers 34 and 35 lying in between and outer conductor layers 31, 38 (FIG. 4). In this case too, each conductor layer is provided with a corresponding connecting layer 32, 33, 36, 37 which adhesively bonds the conductor layer to the respective thin glass layer. In this case, the inner conductor layers 34, 35 are expediently embedded in an associated connecting layer 33 and 36, respectively. It goes without saying that such a multilayer printed circuit board 30 may also be provided with plated-through holes (not shown in FIG. 4) which are produced in a manner known per se and connect conductor tracks in different conductor layers to one another.

Figure 3:
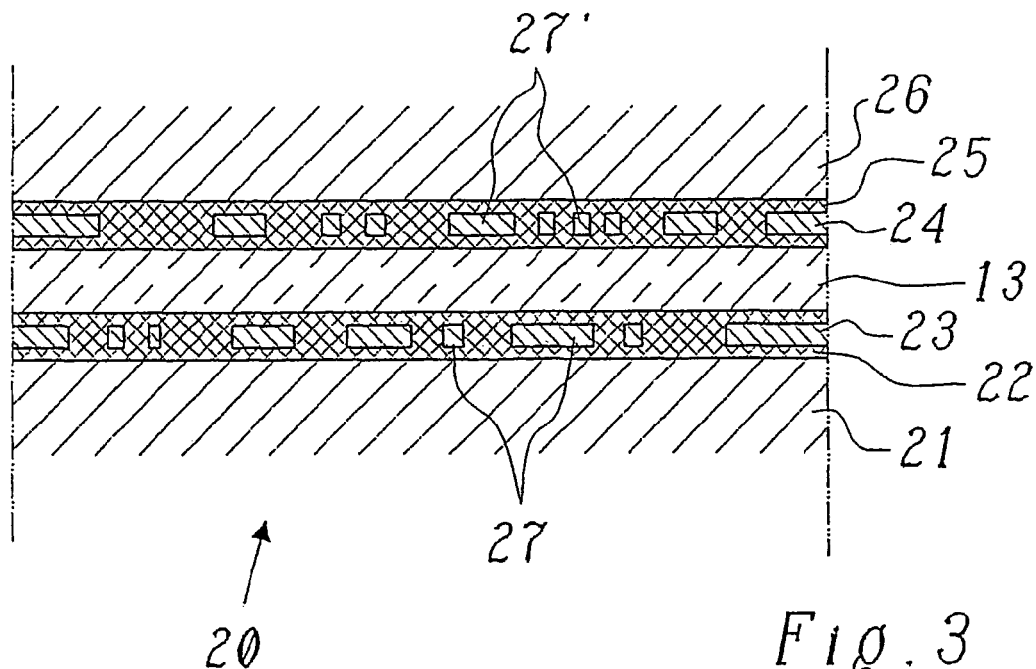
FIG. 3 shows, in a sectional illustration, the construction of a (structured) printed circuit board in accordance with a second preferred exemplary embodiment of the invention.

Another possibility within the scope of the invention consists in integrating a thin glass layer that is provided with a conductor layer on one side or on both sides into a printed circuit board of a conventional type. Thus, the example illustrated in FIG. 3 shows a printed circuit board 20 in which a central thin glass layer 13 with conductor layers 23, 24 and conductor tracks 27, 27' bonded on both sides is arranged between two insulating plates 21, 26 of a conventional type (e.g. based on epoxy resin or polytetrafluoroethylene) and adhesively bonded to said insulating plates. Connecting layers 22, 25 once again serve here for adhesive bonding, the conductor layers 23, 24 being embedded in said connecting layers.

Figure 6:
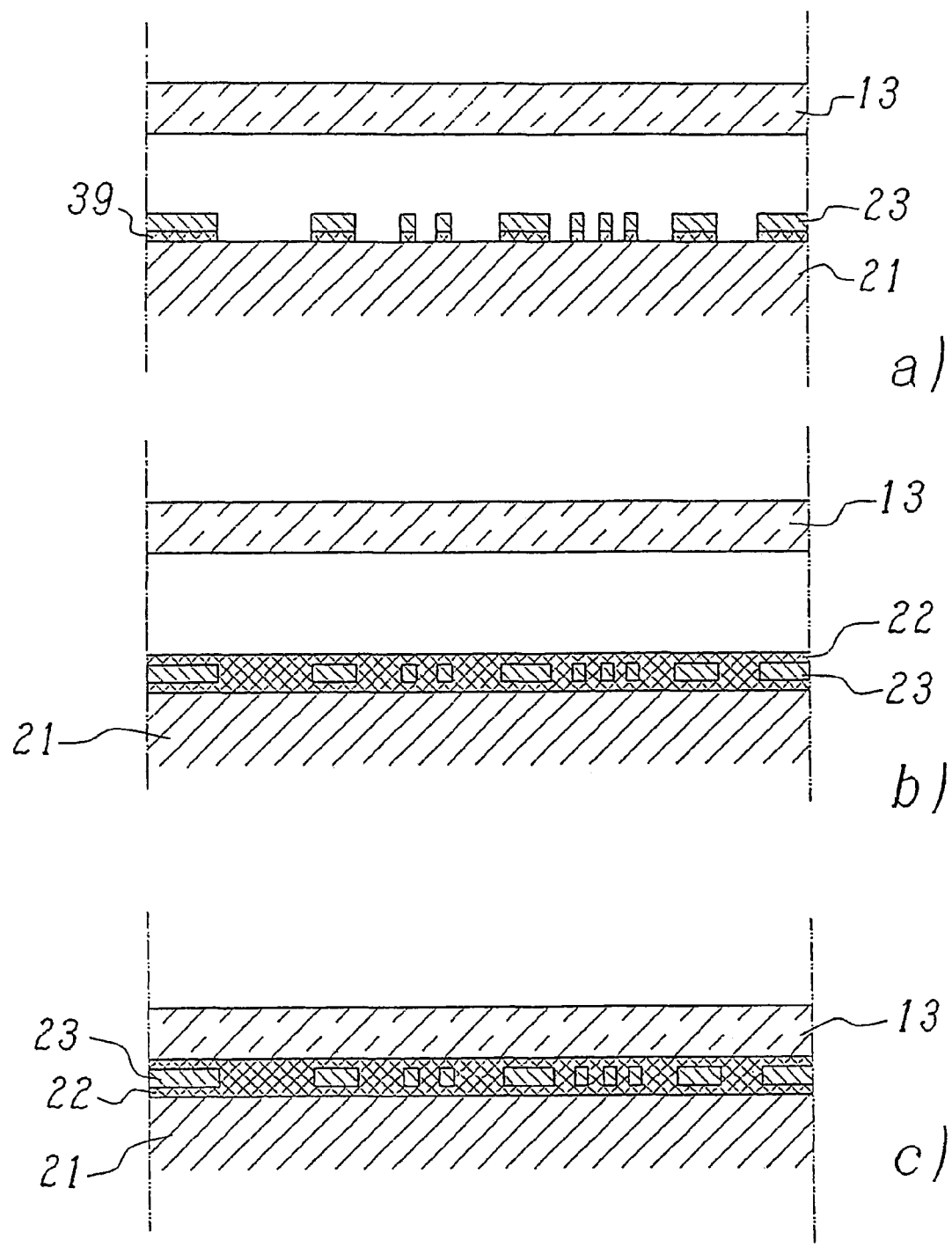
FIGS. 6a–6f show a method for producing a printed circuit board according to FIG. 3 in accordance with another preferred exemplary embodiment of the invention.
Figure 6:
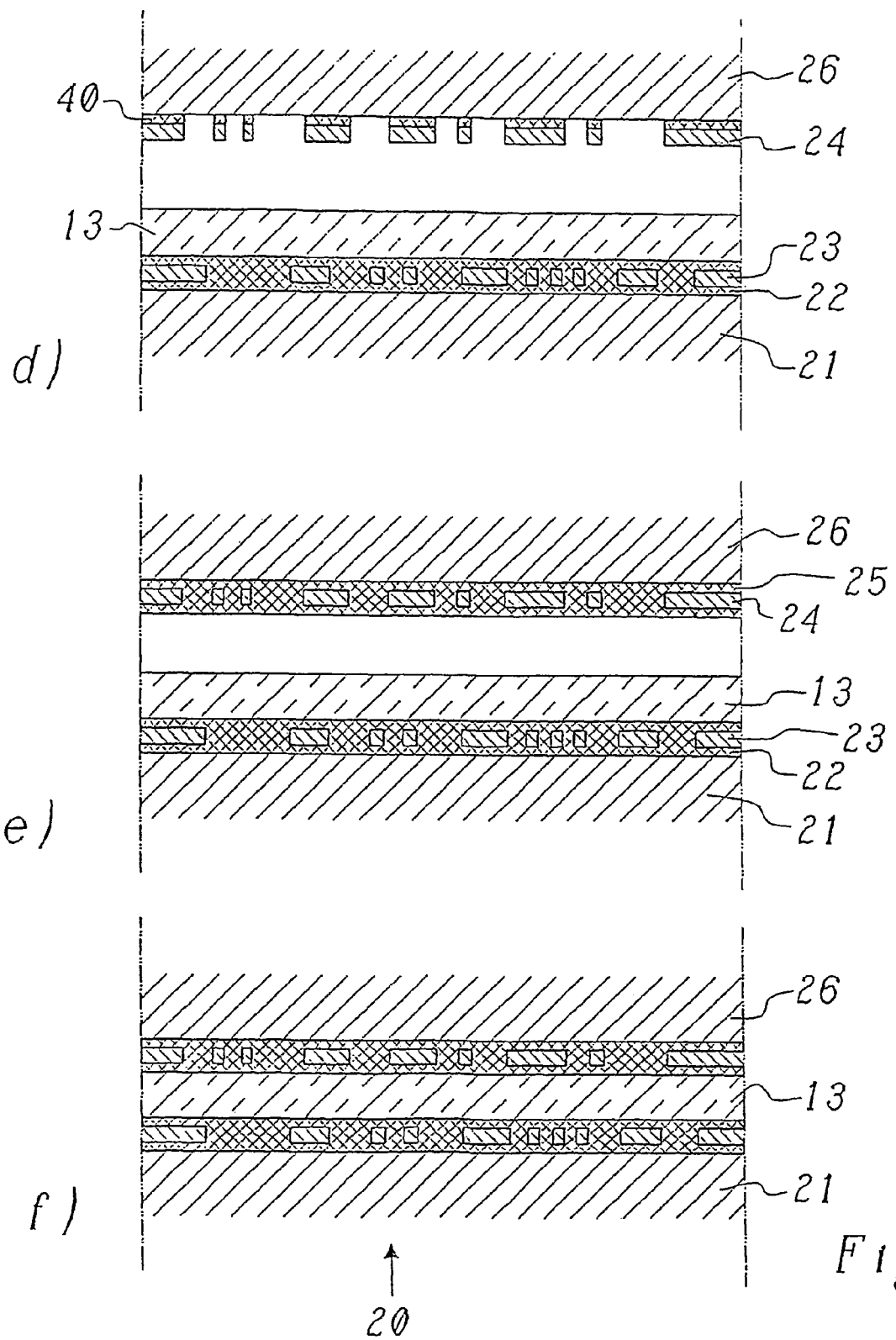

The production of such a "hybrid" printed circuit board 20 with conventional insulating plates and thin glass layers is illustrated in various steps in FIGS. 6(*a*)–(*f*): the starting point is one of the insulating plates, namely the insulating plate 21, onto which a first conductor layer 23 is bonded in a conventional manner by means of a first connecting layer 39 and is then structured (FIG. 6*a*). The first connecting layer 39 is then filled up whilst covering the first conductor layer to form the final connecting layer 22 (FIG. 6*b*). The structure 21, 22, 23 thus prepared is thereupon adhesively bonded on one side to a correspondingly pretreated thin glass layer 13 (FIG. 6*c*). A further structure 24, 25, 26 can then be bonded onto the free side of the thin glass layer 13 (FIGS. 6*e,f*), which structure comprises the other insulating plate 26 provided with a second conductor layer 24. In this case, the second conductor layer 24 is bonded onto the insulating plate 26 by means of a second connecting layer 40, and subsequently structured (FIG. 6*d*), and the second connecting layer 40 is then filled up to form the final connecting layer 25 (FIG. 6*e*). In this exemplary embodiment too, it is conceivable to use resin-coated Cu metal foils to produce the conductor layers 23 and 24.

Overall, the invention yields a printed circuit board which is distinguished by the following properties and advantages:

- The printed circuit boards can be made very thin without losses in mechanical stability
- A direct mounting of semiconductor chips is possible by virtue of the adaptation of the thermal expansion coefficients of the central dielectric (thin glass) to the customary semiconductor materials
- The optical quality, homogeneity and uniformity in the dimensions of the thin glass material avoid disturbing influences on the signal propagation, in particular at high frequencies
- The comparatively good thermal conductivity of the thin glass layer facilitates the dissipation of heat and thus allows higher integration densities
- The small relative permittivity and the small dielectric loss factor of the thin glass material enable the circuit arranged on the printed circuit board to have very high frequencies
- The thin glass layers are commercially available in outstanding quality and at favorable prices from series production and therefore limit the costs of the printed circuit boards
- The thin glass layers can be worked and processed well in the context of printed circuit board production; in particular, known methods of printed circuit board production can be used without difficulty
- Multilayer printed circuit boards can be produced without difficulty, which boards can be made even more compact on account of the small thickness of the thin glass layers
- Even finer conductor track structures are possible on account of the high degree of homogeneity and uniformity of the dielectric.

The layer composite material produced by the method according to the invention is particularly well suited as starting material for the printed circuit board. However, it is also conceivable to use this material in other applications.

LIST OF REFERENCE SYMBOLS 10, 20, 30 Printed circuit board
11, 15 Conductor layer (Cu metal foil)
12, 14 Connecting layer
13, 13', 13" Thin glass layer
16, 17 Conductor track
18 Semiconductor chip
19 Connection contact (semiconductor chip)
21, 26 Insulating plate (e.g. epoxy)
22, 25 Connecting layer
23, 24 Conductor layer (Cu metal foil)
27, 27' Conductor track
28, 29 Resin-coated metal foil (Cu)
31, 34, 35, 38 Conductor track
32, 33, 36, 37 Connecting layer
39, 40 Connecting layer

The invention claimed is:

1. A method of forming a printed circuit board comprising:
    (a) providing a first layer of borosilicate glass;
    (b) laminating first and second metal foils to first and second sides of the layer of borosilicate glass;
    (c) forming a first circuit pattern having at least one conductor track in the first metal foil; and
    (d) operatively mounting a semiconductor chip to the first circuit pattern.

2. The method of claim 1, wherein each metal foil has a thickness no greater than 50 µm.

3. The method of claim 1, further including:
    forming a second circuit pattern having at least one conductor track in the second metal foil; and
    connecting at least one conductor track of the first circuit pattern and at least one conductor track of the second circuit pattern via one or more plated through holes formed through the first layer of boro silicate glass.

4. The method of claim 1, further including:
    (e) forming a second circuit pattern having at least one conductor track in the second metal foil;
    (f) laminating a second layer of borosilicate glass to the second circuit pattern;
    (g) laminating a third metal foil to a side of the second layer of borosilicate glass opposite the second circuit pattern; and
    (h) forming a third circuit pattern having at least one conductor track in the third metal foil.

5. The method of claim 4, further including:
    connecting at least one conductor track of the second circuit pattern and at least one conductor track of the third circuit pattern via one or more plated through holes formed through the second layer of borosilicate glass.

6. The method of claim 4, wherein:
    the second layer of borosilicate glass is laminated to the second circuit pattern via a connecting layer; and
    the second circuit pattern is embedded in the connecting layer used to laminate the second layer of borosilicate glass to the second circuit pattern.

7. The method of claim 4, further including operatively mounting another semiconductor chip to the third circuit pattern.

8. The method of claim 4, further including:
    (i) laminating a third layer of borosilicate glass to the third circuit pattern;
    (j) laminating a fourth metal foil to a side of the third layer of borosilicate glass opposite the third circuit pattern;
    (k) forming a fourth circuit pattern in the fourth metal foil; and
    (l) operatively mounting another semiconductor chip to the fourth circuit pattern.

9. The method of claim 8, wherein:
    the third layer of borosilicate glass is laminated to the third circuit pattern via a connecting layer; and
    the third circuit pattern is embedded in the connecting layer used to laminate the third layer of borosilicate glass to the third circuit pattern.

10. The method of claim 8, wherein each metal foil is laminated to its layer of borosilicate glass via a corresponding connecting layer.

11. The method of claim 10, wherein the connecting layer comprises a resin and a silane.

12. A printed circuit board comprising:
    a first layer of borosilicate glass;
    first and second metal foils laminated to first and second sides of the layer of borosilicate glass, wherein a first circuit pattern having at least one conductor track is defined from the first metal foil; and
    a semiconductor chip operatively mounted to the first circuit pattern.

13. The printed circuit board of claim 12, wherein:
    a second circuit pattern having at least one conductor track is defined from the second metal foil; and
    the first layer of borosilicate glass includes one or more plated through holes connecting at least one conductor track of each of the first and second circuit patterns to each other.

14. The printed circuit board of claim 13, further including:
    a second layer of borosilicate glass laminated to the second circuit pattern;
    a third metal foil laminated to a side of the second layer of borosilicate glass opposite the second circuit pattern, wherein a third circuit pattern having at least one conductor track is defined from the third metal foil; and
    the second layer of borosilicate glass includes one or more plated trough holes connecting at least one conductor track of each of the second and third circuit patterns to each other.

15. The printed circuit board of claim 14, wherein:
    the second layer of borosilicate glass is laminated to the second circuit pattern via a connecting layer; and
    the second circuit pattern is embedded in the connecting layer.

16. The printed circuit board of claim 14, wherein each metal foil is laminated to its side of borosilicate glass via a corresponding connecting layer.

17. The printed circuit board of claim 16, wherein each connecting layer comprises a resin, and a silane.

18. The printed circuit board of claim 12, wherein:
    the first layer of borosilicate glass has a thickness no greater than 1.1 mm;
    each metal foil is laminated to the first layer of borosilicate glass via a connecting layer having a thickness no greater than 20 µm; and
    each metal foil has a thickness no greater than 50 µm.

19. A printed circuit board comprising:
    a first metal layer;
    a first layer of borosilicate glass having a first side laminated to a side of the first metal layer;

a second metal layer laminated to a second side of the first layer of borosilicate glass;

a second layer of borosilicate glass having a first side laminated to a side of the second metal layer opposite the first layer of borosilicate glass; and a third metal layer laminated to a second side of the second layer of borosilicate glass, wherein:

at least two of the metal layers have circuit patterns defined therein;

each circuit pattern has at least one conductor track;

conductor tracks of the metal layers having circuit patterns defined therein are electrically connected by one or more plated through holes formed in one or more of the layers of borosilicate glass; and at least one semiconductor chip is operatively mounted to one of the first and third circuit patterns.

20. The printed circuit board of claim 19, wherein each metal foil is laminated to its side of borosilicate glass via a corresponding connecting layer.

21. The printed circuit board of claim 20, wherein each connecting layer comprises a resin and a silane.

* * * * *

UNITED STATES PATENT AND TRADEMARK OFFICE
CERTIFICATE OF CORRECTION

| | | |
|---|---|---|
| PATENT NO. | : 7,226,653 B2 | Page 1 of 1 |
| APPLICATION NO. | : 10/398961 | |
| DATED | : June 5, 2007 | |
| INVENTOR(S) | : Straub et al. | |

It is certified that error appears in the above-identified patent and that said Letters Patent is hereby corrected as shown below:

Column 7, line 36, Claim 3, "boro silicate" should read -- borosilicate --

Column 8, line 42, Claim 14, "trough holes" should read -- through holes --

Signed and Sealed this

Thirteenth Day of November, 2007

JON W. DUDAS
*Director of the United States Patent and Trademark Office*